United States Patent [19]

Orita

[11] Patent Number: 5,943,286
[45] Date of Patent: Aug. 24, 1999

[54] MEMORY DEVICE HAVING A PLURALITY OF CELL ARRAY BLOCKS INCLUDING REFERENCE CELLS ARE CONNECTED IN SERIES

[75] Inventor: Nobuyuki Orita, Tokyo, Japan

[73] Assignee: NEC Corporation, Tokyo, Japan

[21] Appl. No.: 08/908,712

[22] Filed: Aug. 8, 1997

[30] Foreign Application Priority Data

Aug. 9, 1996 [JP] Japan ................................. 8-210881

[51] Int. Cl.⁶ ..................................................... G11C 8/00
[52] U.S. Cl. .............................. 365/230.03; 365/185.16; 365/185.2; 365/189.09
[58] Field of Search ............................. 365/225.07, 208, 365/104, 185.25, 230.03, 203, 191, 185.16, 185.18, 185.2, 189.09

[56] References Cited

U.S. PATENT DOCUMENTS

| | | | |
|---|---|---|---|
| 4,912,674 | 3/1990 | Matsumoto et al. | 365/104 |
| 4,933,906 | 6/1990 | Terada et al. | 365/208 |
| 5,392,233 | 2/1995 | Iwase | 365/104 |
| 5,703,820 | 12/1997 | Kohno | 365/204 |
| 5,754,475 | 5/1998 | Bill et al. | 365/185.25 |

FOREIGN PATENT DOCUMENTS

| | | |
|---|---|---|
| 5-167042 | 7/1993 | Japan . |
| 6-44778 | 2/1994 | Japan . |

*Primary Examiner*—David Nelms
*Assistant Examiner*—Thong Le
*Attorney, Agent, or Firm*—Foley & Lardner

[57] ABSTRACT

A memory device includes a memory cell block, a reference cell block and a comparator. The memory cell block includes a plurality of cells, and a memory bit line is connected to a selected one of the cells. The reference cell block includes a plurality of cells, and a reference bit line is connected to a predetermined number of cells which are connected in series. The comparator compares a memory signal received from the memory bit line to a reference signal received from the reference bit line to determine a bit data of the selected cell.

22 Claims, 9 Drawing Sheets

(COMPARISON)

5,943,286

MEMORY DEVICE HAVING A PLURALITY OF CELL ARRAY BLOCKS INCLUDING REFERENCE CELLS ARE CONNECTED IN SERIES

BACKGROUND OF THE INVENTION

1. Field of the Invention

The present invention generally relates to a semiconductor memory device having a plurality of cell array blocks.

2. Description of the Related Art

In a semiconductor memory device such as a masked ROM (read-only memory) having a plurality of cell array blocks, there have been proposed several circuit configurations which reduce the capacitance of conductive lines to achieve high-speed data reading.

For example, in Japanese Patent Unexamined Publication No. 5-167042, the ROM is provided with an ON/OFF switching transistor between a virtual ground line and a bit line or between a bit line and a main bit line so as to select a desired series of memory cells. This can provide linearly arranged main bit lines and virtual ground lines, resulting in reduced capacitance thereof.

Another conventional memory device is disclosed in Japanese Patent Unexamined Publication No. 6-44778. In this device, a memory cell array is divided into a plurality of banks which can be selectively precharged. Since only a selected bank is precharged, the capacitance of a part to be precharged is reduced, resulting in the reduced time required for precharging.

SUMMARY OF THE INVENTION

It is important not only to increase the operation speed but also to improve the reliability and stability of memory operations, especially in a semiconductor memory device having a reference circuit which generates a reference voltage to be used for read data decision. To compare a read voltage of a selected memory cell to the reference voltage to determine which data is stored in that memory cell, 1 or 0, the reference voltage is set to a voltage level between a conduction read voltage and a non-conduction read voltage of a memory cell. Such a reference voltage may be obtained by a plurality of reference cells connected in series in the bit-line direction. The reference cells are the same circuit structure as a memory cell and, therefore, they are preferably included in the same cell array as the memory cells. If they are separately provided outside the cell array, which may be used in a relatively-low speed memory device, the larger space for memory device is needed.

However, in the case of a memory device having a plurality of cell array blocks formed therein, it is undesirable that the reference cells are formed over a plurality of cell array blocks. The reason is that the cell array blocks used for reference cells are electrically connected in series by removing some diffused contacts to ground lines or bit lines from each cell array block to connect that cell array block to the adjacent ones. Since the other memory cell blocks are provided with such diffused contacts, there is a difference in parasitic capacitance between bit lines for memory cells and for reference cells.

Such a difference in parasitic capacitance causes a difference in time constant between the bit lines for memory cells and for reference cells. Therefore, compared with the case where the read data voltage is synchronized with the reference voltage, the time instant of data decision is delayed. Further, in case of variations of ground level due to noise, the difference between a read voltage of a selected memory cell and the reference voltage is reduced and finally their polarity may be reversed, resulting in an incorrect reading of data.

An object of the present invention is to provide a semiconductor memory which can achieve stable and reliable memory data decision.

Another object of the present invention is to provide a semiconductor memory which can reduce the difference in capacitance between a bit line for memory cells and a reference bit line for reference cells.

According to the present invention, a memory device includes a first and second cell blocks and a comparator. The first cell block is comprised of a plurality of cells and a first bit line is electrically connected to a selected one of the cells. The second cell block is comprised of a plurality of cells and a second bit line is electrically connected to a predetermined number of cells which are connected in series. The comparator compares a first signal received from the first bit line to a second signal received from the second bit line to determine bit data of the selected cell.

According to another aspect of the present invention, a memory device includes a plurality of first cell blocks each comprising a plurality of cells and a first bit line contact which is connected to a selected one of the cells, and a predetermined number of first cell blocks is connected to a first bit line through the first bit line contacts thereof. The memory device further includes a plurality of second cell blocks each comprising a plurality of cells and a second bit line contact, the predetermined number of second cell blocks being connected to a second bit line through the second bit line contacts thereof, wherein a predetermined cell block of the second cell blocks includes a reference element which is formed with a plurality of cells connected in series, the reference element being connected to the second bit line through a second bit line contact thereof. A first signal received from the first bit line is compared to a second signal received from the second bit line to determine the bit data of the selected cell.

DETAILED DESCRIPTION OF THE PREFERRED EMBODIMENTS

Figure 1:
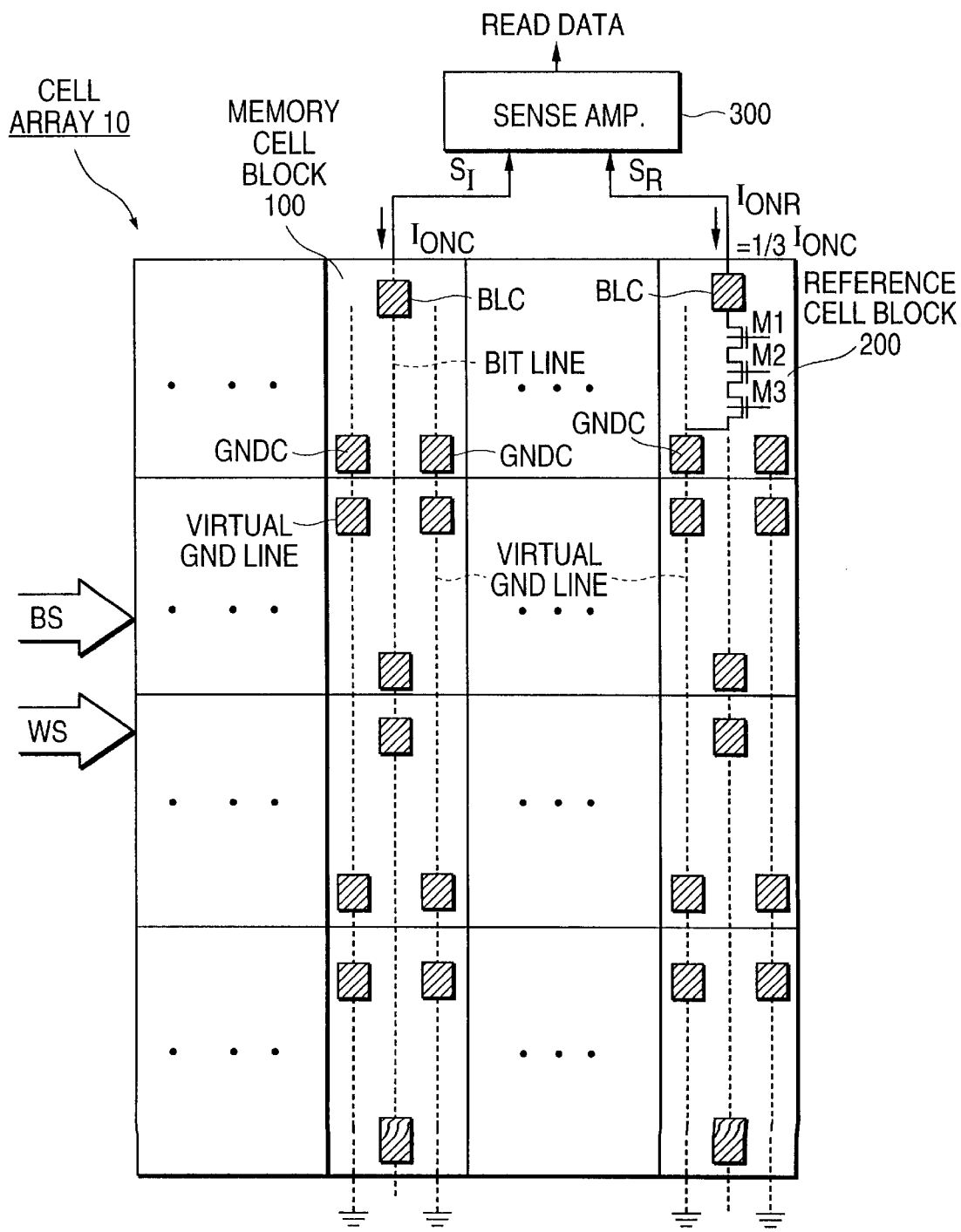
FIG. 1 is a schematic diagram showing a semiconductor memory device according to an embodiment of the present invention.

Referring to FIG. 1, a semiconductor memory device is comprised of a cell block array 10 having a plurality of cell blocks arranged in rows and columns, each cell block including a plurality of cells in rows and columns with the same basic circuit structure. In this embodiment, the cell blocks consists of memory cell blocks (MCBs) 100 and a reference cell block (RCB) 200 which are respectively formed by selective ion implantation as will be described later. The reference cell block 200 uses the same transistors as the memory cell blocks to have the same variations in performance as the memory cell blocks.

The bit-line contact BLC and the ground contact GNDC of each cell block are connected to a bit line and a virtual ground line, respectively, which will be described in detail. A selected bit line of memory cell blocks 100 in column and a reference bit line of reference cell blocks 200 are connected to a sense amplifier 300. Since the selected bit line is connected to the virtual ground line through a selected memory cell, the signal current $I_{ONC}$ flows through the selected memory cell depending on the ON/OFF state of the selected memory cell. In other words, the sense amplifier 300 receives the signal current $I_{ONC}$ as data stored in the selected memory cell.

The reference cell block 200 has a plurality of cells connected in series between the bit-line contact BLC and a ground contact GNDC therein. Since each cell has a resistance in conduction state (ON resistance), the sense amplifier 300 receives the reference current $I_{ONR}$ which is smaller than the signal current $I_{ONC}$. For example, in the case where the reference current $I_{ONR}$ is one third the signal current $I_{ONC}$, three reference cells M1–M3 may be connected in series as shown in FIG. 1. In this case, the bit-line contact and the ground contact of the reference cell block 200 are connected to the reference bit line and the virtual ground line, respectively, and it is the same with the bit-line contact BLC and the ground contact GNDC of the memory cell block 100. Therefore, the capacitance of the reference bit line may be approximately equal to the bit line of the memory cell block 100.

The sense amplifier 300 compares the memory data signal $S_I$ to the reference signal $S_R$ to determine whether the stored data is 1 or 0. Since the capacitance of the reference bit line is approximately equal to the bit line of the memory cell block 100, the sense amplifier 300 stably and reliably produce the read data even when the ground level varies due to noise as will be described in detail.

Figure 2:
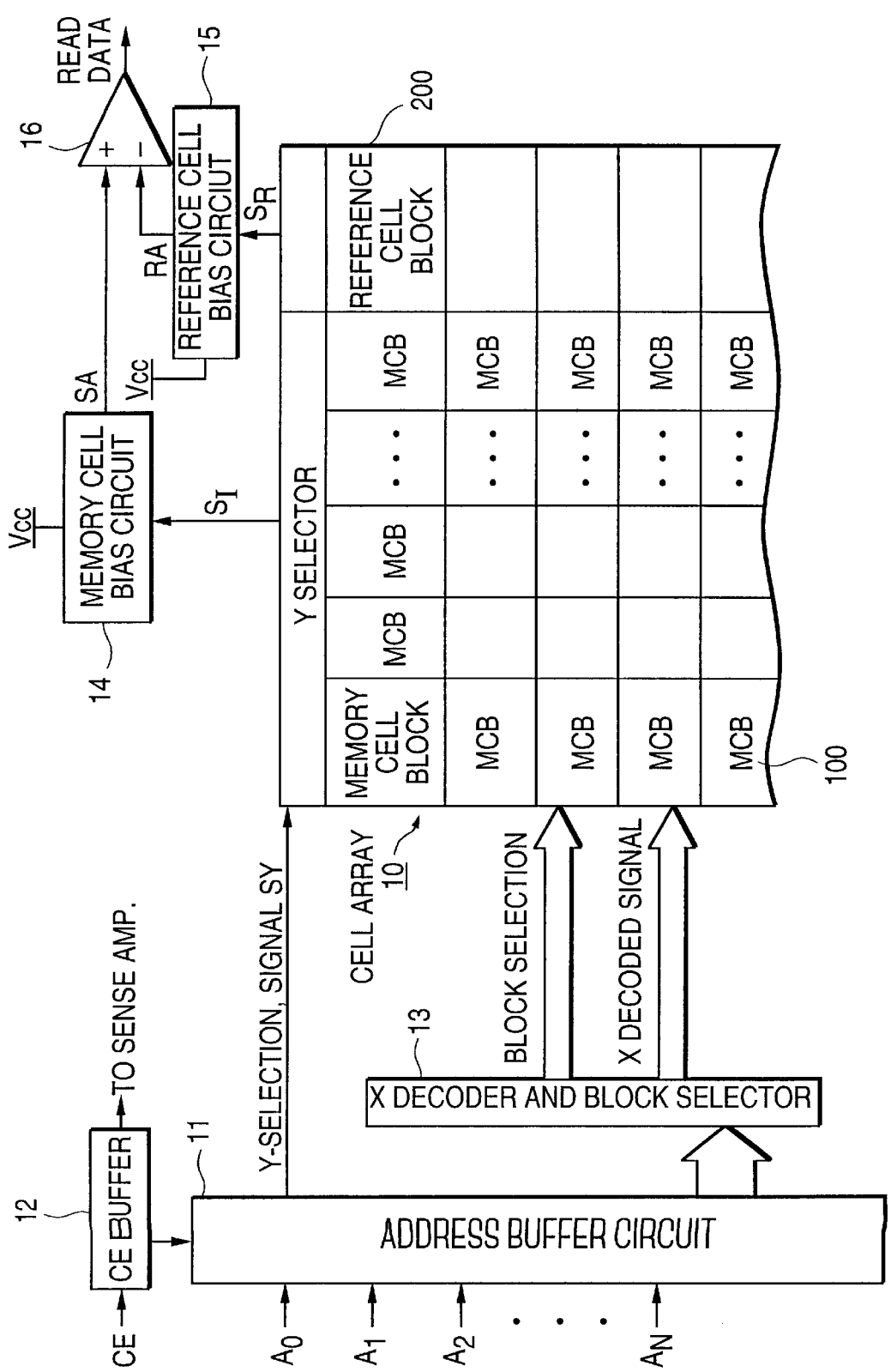
FIG. 2 is a more detailed diagram showing the semiconductor memory device according to the embodiment.

Referring to FIG. 2, an address buffer 11 stores address data and a CE buffer 12 stores chip enable CE. The address buffer 11 provides X address data and Y-selection signal SY to an X decoder 13 and Y selector, respectively. The X decoder 13 outputs block selection signal BS and X decoded signal (or word selection signal) WS to the cell array 10. The block selection signal BS selects one of the memory cell blocks 100 and further a single memory cell is selected from the selected memory cell block 100 depending on the X decoded signal WS and the Y-selection signal SY.

The Y selector selects one bit line and outputs the memory data signal $S_I$ to a memory cell bias circuit 14 which produces a memory data voltage SA. The reference signal $S_R$ is output to a reference cell bias circuit 15 which produces a reference voltage RA. A differential amplifier 16 receives the memory data voltage SA and the reference voltage RA and compares them to produce read data. The sense amplifier 300 of FIG. 1 is comprised of the memory cell bias circuit 14, the reference cell bias circuit 15, and the differential amplifier 16.

Figure 3:
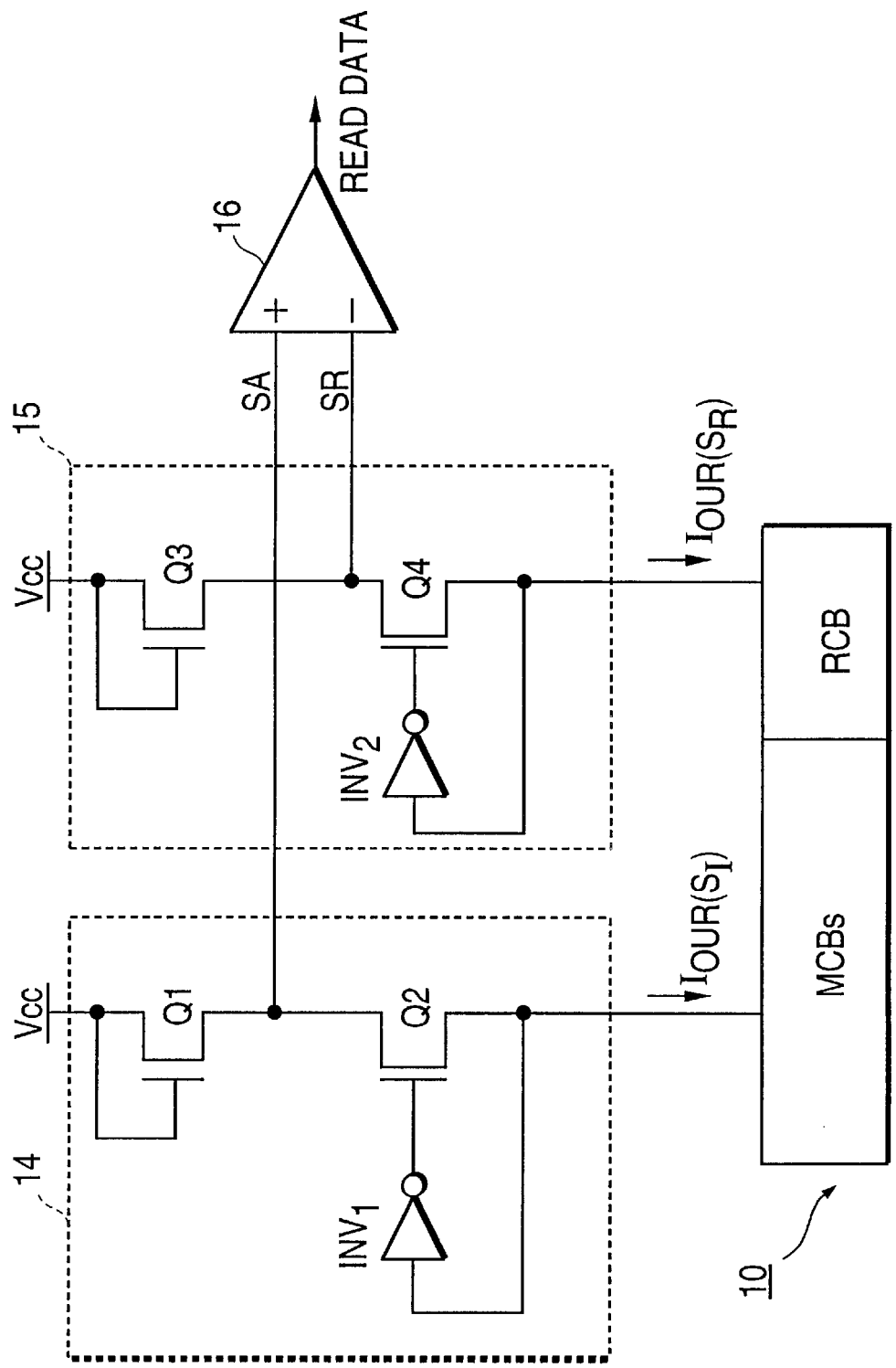
FIG. 3 is a circuit diagram showing a sense amplifier of the semiconductor memory device according to the embodiment.

Referring to FIG. 3, the memory cell bias circuit 14 and the reference cell bias circuit 15 have the same circuit configuration. More specifically, the memory cell bias circuit 14 is comprised of a field effect transistor (FET) Q1, FET Q2 and an inverter INV1. The FET Q1 serves as a resistor and a combination of the FET Q2 and the inverter INV1 serves as an ON/OFF switch depending on the state of a selected memory cell. When the selected memory cell is on, the FET Q2 is forced into conduction and thereby the memory data voltage SA goes low. Contrarily, when the selected memory cell is off, the FET Q2 is forced into non-conduction and thereby the memory data voltage SA goes high.

In the reference cell bias circuit 15, since a plurality of cells are connected in series between the bit-line contact BLC and a ground contact GNDC in the reference cell block 200, the reference current $I_{ONR}$ flows with keeping the FET Q4 on. Therefore, a reference voltage SR that is lower than the high voltage of the memory data voltage SA is generated by the resistance of the FET Q3 and the total resistance of the cells connected in series.

Figure 4:
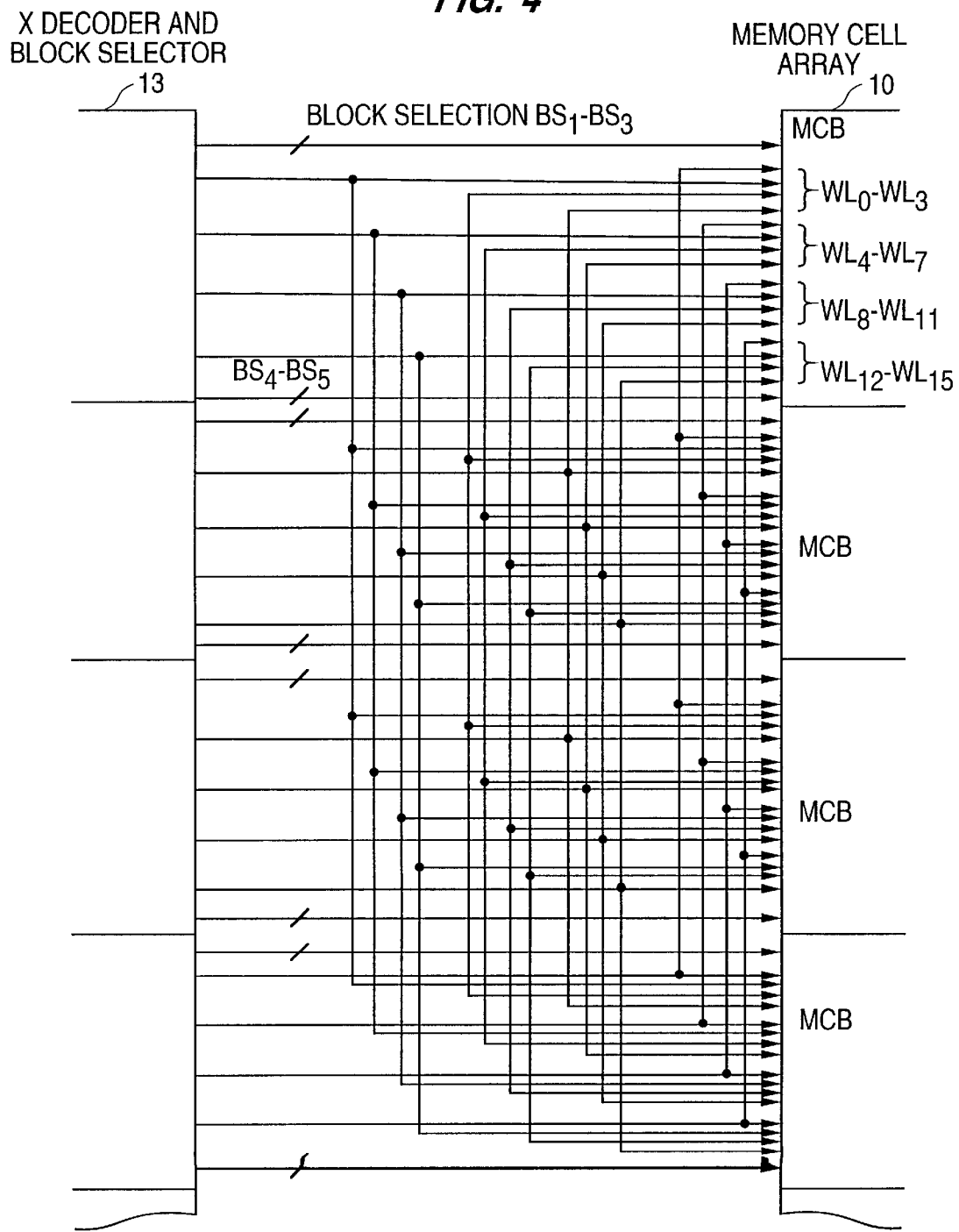
FIG. 4 is a detailed wiring diagram showing the interconnections between an X decoder and a memory cell array of of FIG. 2.

Referring to FIG. 4, there is shown an example of the wiring between the X decoder 13 and the cell array 10. Here, each memory cell block 100 has 16 word lines and the X decoder 13 can concurrently drive 4 word lines. Each of 16 X-decoded signals is output to 4 memory cell blocks and thereby each memory cell block receives 16 word lines: $WL_0$–$WL_3$, $WL_4$–$WL_7$, $WL_8$–$WL_{11}$, and $WL_{12}$–$WL_{15}$. Hereinafter, the details of the reference cell block 200 will be described in the case of the example as shown in FIG. 4.

Figure 5:
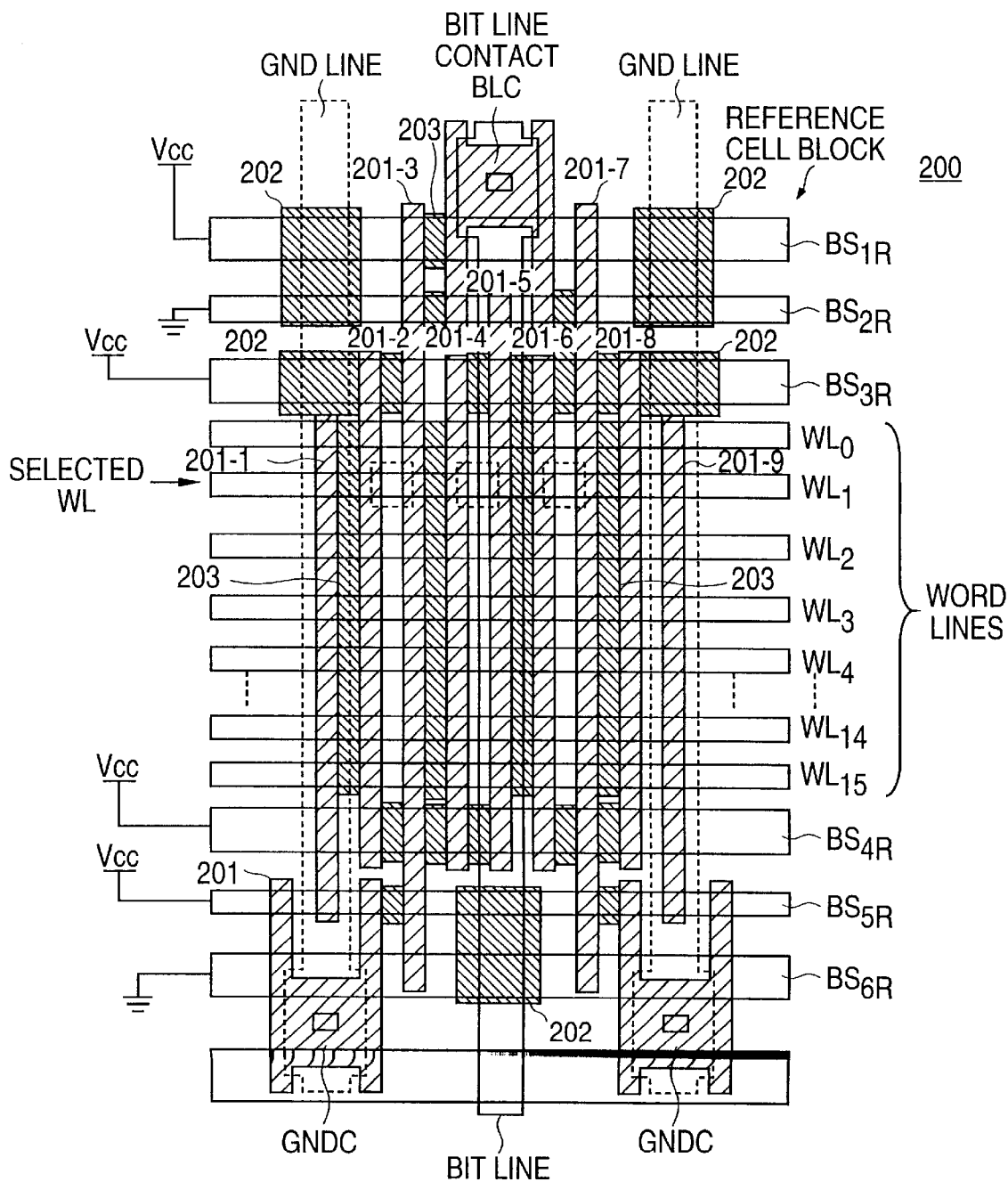
FIG. 5 is a schematic plan view showing an example of a reference cell block in the embodiment.
Figure 6:
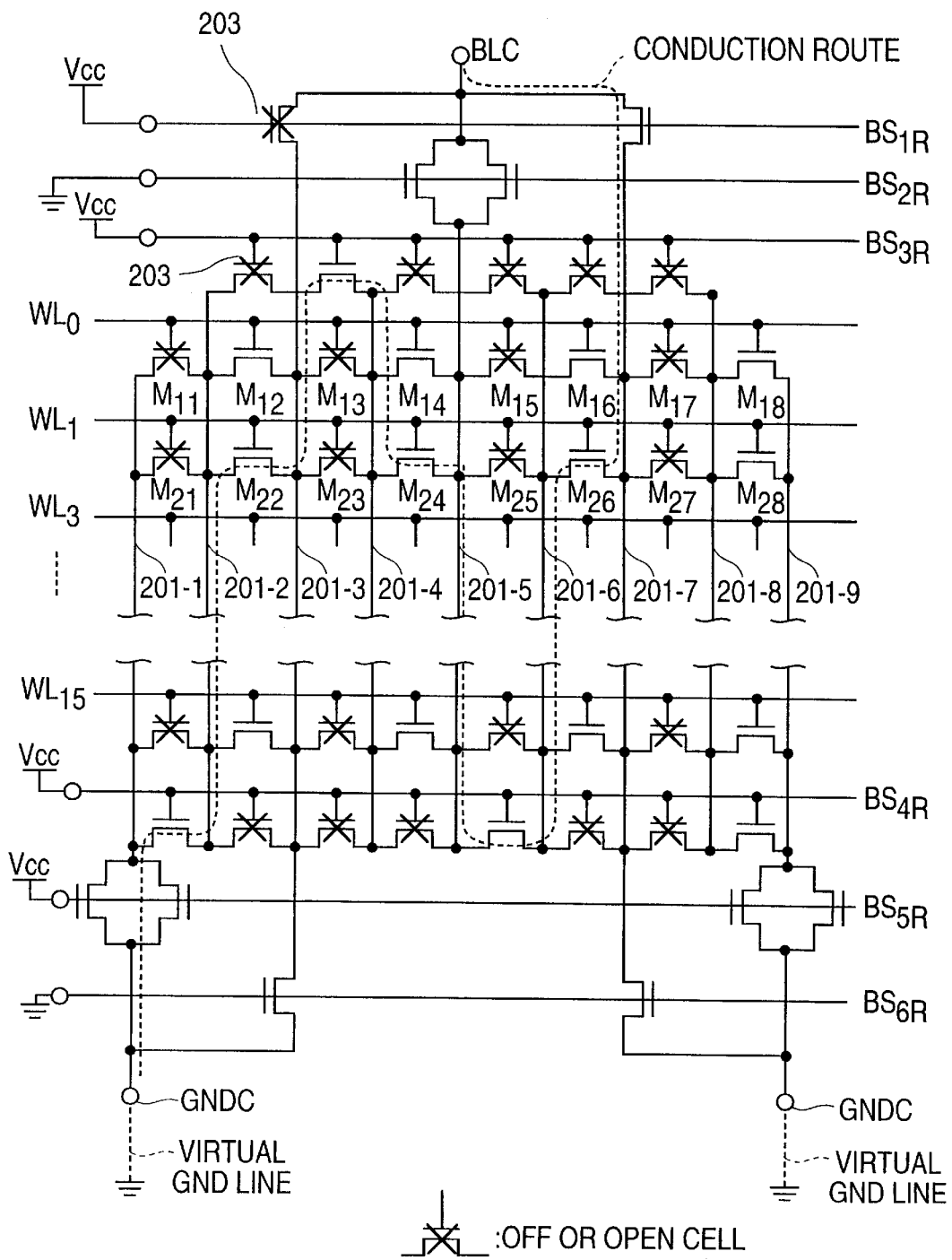
FIG. 6 is a circuit diagram showing the reference cell block of FIG. 5.

Referring to FIGS. 5 and 6, a plurality of N$^+$-diffused lines 201-1 to 201-9 are formed in a memory chip substrate, and a plurality of word lines $WL_0$–$WL_{15}$ are formed on the substrate with intersecting the N$^+$-diffused lines 201-1 to 201-9 at right angles. Two regions at the intersections of one word line and two adjacent N$^+$-diffused lines are a source and a drain of a memory cell, respectively, and a word line between the two regions is a gate which controls the channel formed between the source and drain. Therefore, a combination of one word line and two adjacent N$^+$-diffused lines forms one FET, that is, a memory cell. For example, at the intersections of the word line $WL_1$ and two adjacent N$^+$-diffused lines 201-1 and 201-2, the source and drain of a memory cell $M_{21}$ are formed, and at the intersections of the word line $WL_1$ and two adjacent N$^+$-diffused lines 201-2 and 201-3, those of an adjacent memory cell $M_{22}$ are formed.

The threshold level of the channel region in each memory cell is determined by means of ion implantation. More specifically, in the case where ions are implanted into the channel regions of selected memory cells, those selected memory cells have a high threshold level and become an off memory cell. Other memory cells into which ions are not implanted have a low threshold level and become a normally-off memory cell. Therefore, when a high voltage is applied to the word line $WL_1$, for example, the ion-implanted memory cell $M_{21}$ remains off and, contrarily the not-ion-implanted memory cell $M_{22}$ is forced into conduction, that is, becomes on (see FIG. 6). In such a selective ion implantation manner, a memory cell block 100 and a reference cell block are formed. As shown in FIG. 5, crosshatched areas 202 and 203 are ion implantation regions which increase the threshold level, forming off-FETs or off-memory cells.

First block selection lines $BS_{1R}$–$BS_{3R}$ parallel to the word lines are formed between the bit-line contact BLC and the word line $WL_0$. Second block selection lines $BS_{4R}$–$BS_{8R}$ parallel to the word lines are formed between the ground contacts GNDCs and the word line $WL_{15}$. As in the case of the word lines, a combination of one block selection line and two adjacent N+-diffused lines forms one FET (here, on/off transistor). For example, at the intersections of the block selection line $BS_{1R}$ and two adjacent N+-diffused lines 201-6 and 201-7, the source and drain of a switching FET are formed. In this example, the high voltage $V_{CC}$ is applied to the block selection lines $BS_{1R}$, $BS_{3R}$, $BS_{4R}$, and $BS_{5R}$ and the other block selection lines $BS_{3R}$ and $BS_{6R}$ are grounded. The bit-line contact BLC is electrically connected to the bit line and the ground contacts GNDCs are electrically connected to the virtual ground lines.

In the reference cell block 200 as shown in FIG. 5, since ions are implanted into the channel regions between the adjacent N+-diffused lines 201-1 and 201-2, the memory cells M11, M21, . . . of the first column are off as shown in FIG. 6. Since ions are not implanted into the channel regions between the adjacent N+-diffused lines 201-2 and 201-3, the memory cells M12, M22, . . . of the second column are normally off and turns on when the corresponding word line is selected. It is the same with other memory cells and FETs of the block selection lines. In this manner, the memory cells in the odd-numbered columns are kept off and those in the even-numbered columns are set to be normally off. The equivalent circuit of the reference cell block 200 of FIG. 5 is shown in FIG. 6.

Referring to FIG. 6, since the high voltage $V_{CC}$ is applied to the block selection lines $BS_{1R}$, $BS_{3R}$, $BS_{4R}$, and $BS_{5R}$, the bit-line contact BLC is electrically connected to one of the ground contacts GNDCs through three normally-off memory cells belonging to the even-numbered columns when one of the word lines is selected. More specifically, when the second word line $WL_1$, for example, is selected as shown in this figure, the bit-line contact BLC is electrically connected to the ground contact GNDC through the conduction route indicated by the dashed line as follows: an FET formed at the intersection of the block selection line $BS_{1R}$ and two adjacent N+-diffused lines 201-6 and 201-7, the N+-diffused lines 201-7, the memory cell $M_{26}$, the N+-diffused lines 201-6, an FET formed at the intersection of the block selection line $BS_{4R}$ and two adjacent N+-diffused lines 201-5 and 201-6, the N+-diffused lines 201-5, the memory sell $M_{24}$, the N+-diffused lines 201-4, an FET formed at the intersection of the block selection line $BS_{3R}$ and two adjacent N+-diffused lines 201-3 and 201-4, the N+-diffused lines 201-3, the memory cell $M_{22}$, the N+-diffused lines 201-2, an FET formed at the intersection of the block selection line $BS_{4R}$ and two adjacent N+-diffused lines 201-1 and 201-2, the N+-diffused lines 201-1, and FETs formed at the intersections of the block selection line $BS_{5R}$ and two adjacent N+-diffused lines 201-1 and 201.

Figure 7:
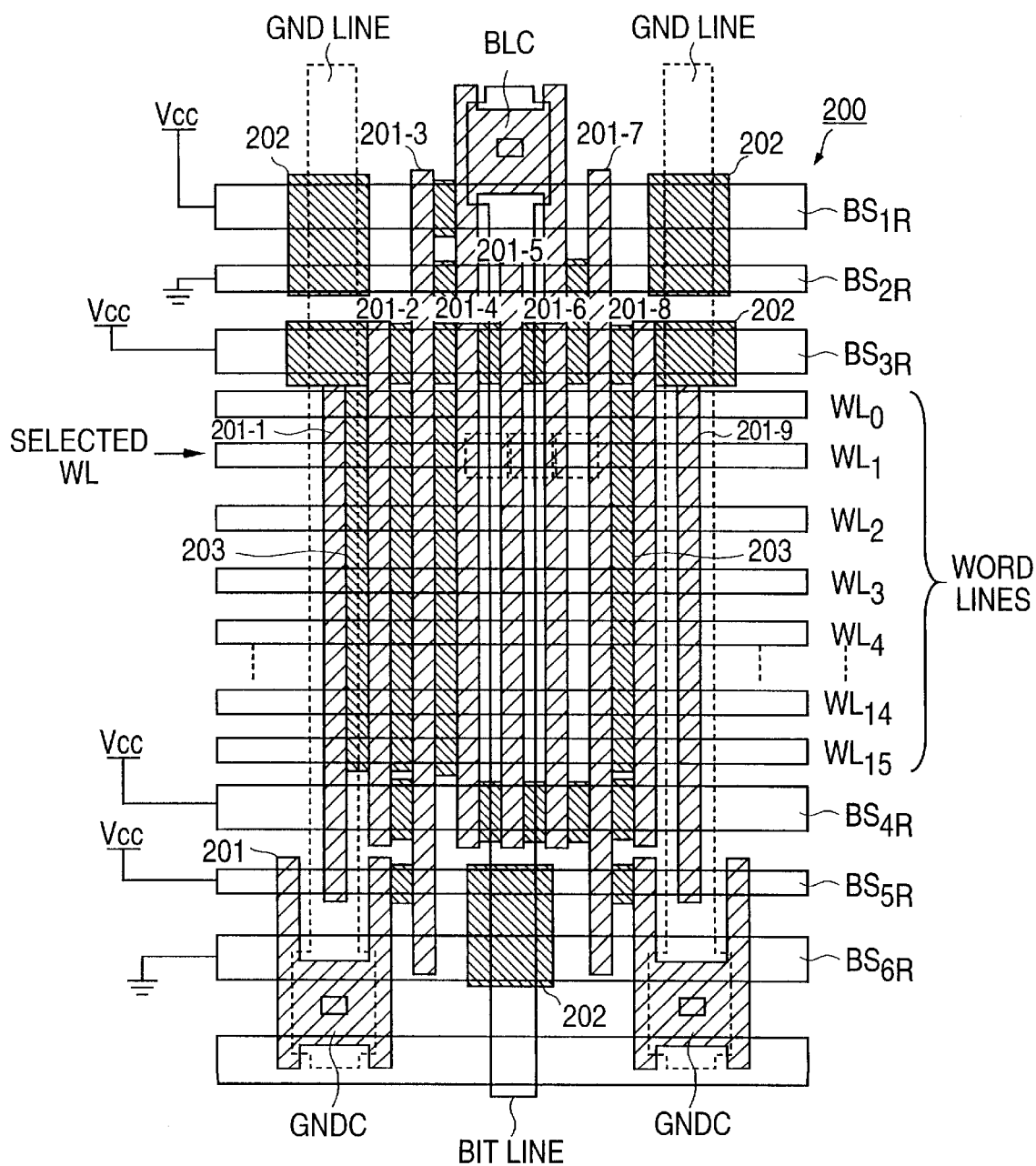
FIG. 7 is a schematic plan view showing another example of a reference cell block in the embodiment.

Referring to FIG. 7, there is shown another example of the reference cell block 200. As in the case of FIG. 5, cross-hatched areas 202 and 203 are ion implantation regions which increase the threshold level, forming off-FETs or off-memory cells, and the high voltage $V_{CC}$ is applied to the block selection lines $BS_{1R}$, $BS_{3R}$, $BS_{4R}$, and $BS_{5R}$ and the other block selection lines $BS_{3R}$ and $BS_{6R}$ are grounded. In this example, the memory cells in the fourth to sixth columns are normally off and the other memory cells are kept off. Therefore, when the second word line $WL_1$, for example, is selected as shown in this figure, the bit-line contact BLC is electrically connected to the ground contact GNDC as follows: an FET formed at the intersection of the block selection line $BS_{1R}$ and two adjacent N+-diffused lines 201-6 and 201-7, the N+-diffused lines 201-7, the consecutive memory cells $M_{26}$, $M_{25}$, and $M_{24}$, the N+-diffused lines 201-4, an FET formed at the intersection of the block selection line $BS_{4R}$ and two adjacent N+-diffused lines 201-3 and 201-4, the N+-diffused lines 201-3, and an FET formed at the intersection of the block selection line $BS_{6R}$ and two adjacent N+-diffused lines 201-3 and 201.

In the above examples of FIGS. 5 and 7, needless to say, a desired number of memory cells may be connected in series in a single reference cell block 200 by selective ion implantation.

Figure 8:
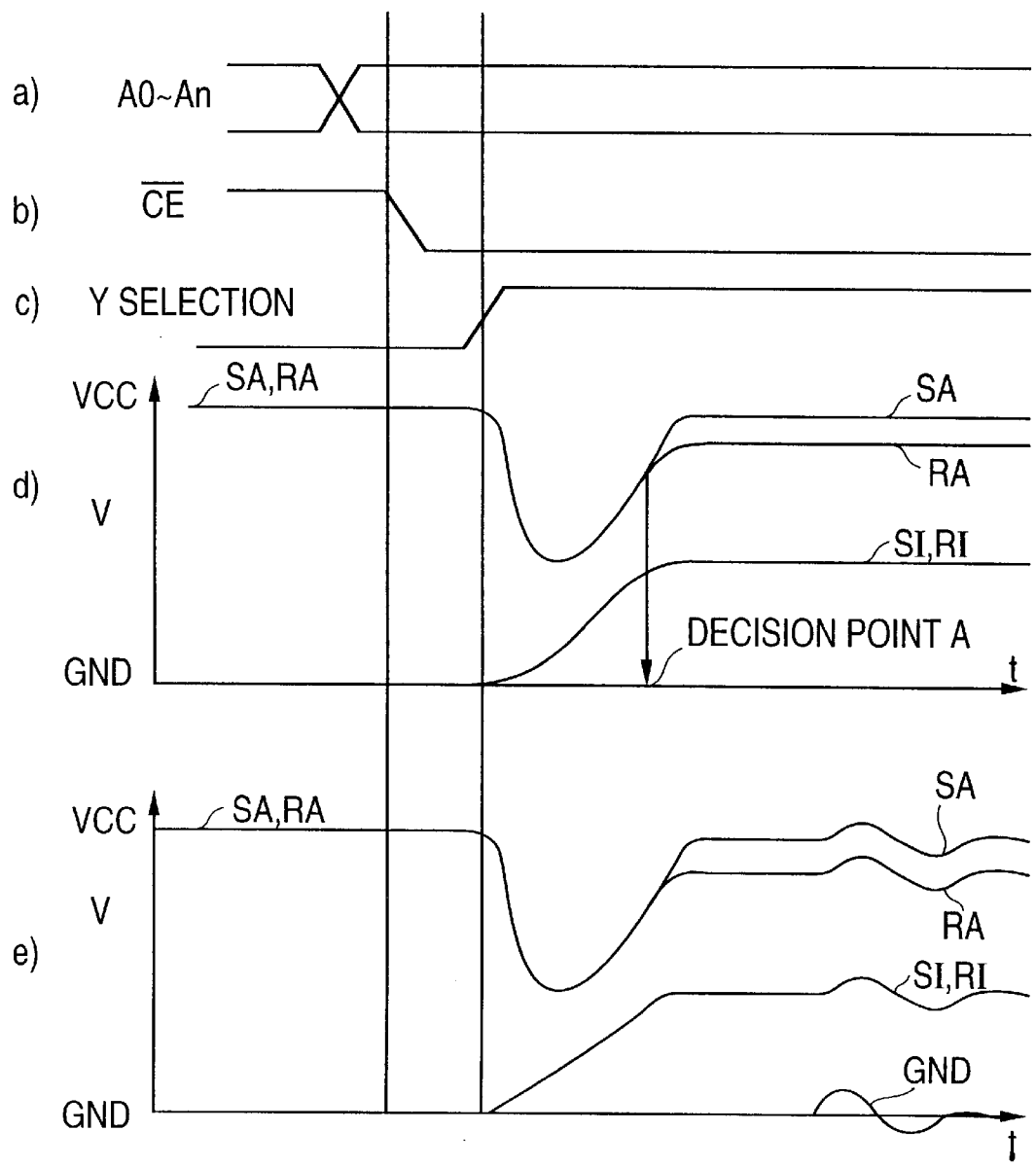
FIG. 8 is a wave form chart showing a data reading operation in the embodiment.
Figure 9:
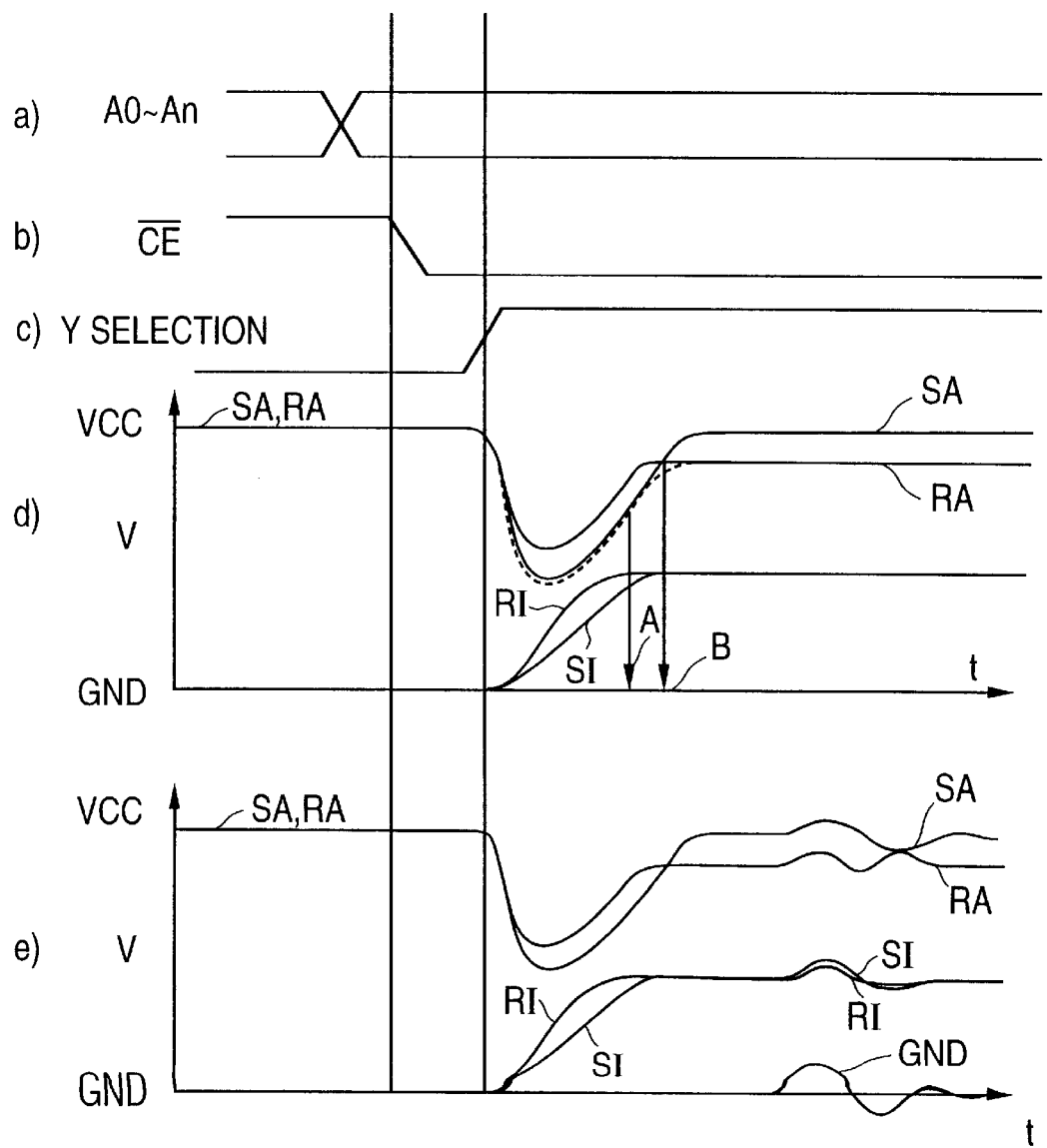
FIG. 9 is a wave form chart showing a data reading operation for comparison.

Referring to FIGS. 8 and 9, there are shown wave forms of the memory data voltage SA, the reference voltage RA, the bit-line voltage SI and the reference bit line voltage RI when an off-memory cell is selected, wherein the wave forms d) show their changes when the ground level is stable and the wave forms e) show their changes when the ground level is changed due to noise.

Referring to FIG. 8, when the Y selector selects one bit line in response to a change of the chip enable CE caused by a change of address data $A_0$–$A_n$, the memory cell bias circuit 14 and the reference cell bias circuit 15 start charging the selected bit line and the reference bit line, respectively. This causes the memory data voltage SA and the reference voltage RA to temporarily fall and the bit-line voltage SI and the reference bit line voltage RI to gradually rise. According to the present invention, since the capacitance of the reference bit line is approximately equal to that of the selected bit line for a column of memory cell blocks, the charging speed of the reference bit line is approximately the same as that of the bit line as shown by SI and RI. Therefore, after the decision point A when the difference between the memory data voltage SA and the reference voltage RA becomes larger, the data decision may be made.

Further, even when the ground level is changed due to noise as shown in e), the change phase of the memory data voltage SA is approximately synchronized with that of the reference voltage RA because the capacitance of the reference bit line is approximately equal to that of the selected bit line. Therefore, even in such a case that the ground level is changed, the correct data decision can be achieved.

Contrarily, as shown in FIG. 9, in the case that the cell array blocks used for reference cells are electrically connected in series over a plurality of cell blocks, the charging speed of the reference bit line is different from that of the bit line as shown by SI and RI in FIG. 9. Because there is a difference in parasitic capacitance between the selected bit line and the reference bit line as described before. Since such a difference in parasitic capacitance causes a difference in time constant between the selected bit line and the reference bit line, the decision point B when the difference between the memory data voltage SA and the reference voltage RA becomes larger lags behind the decision point A obtained in the case of FIG. 8. Further, in case of variations of ground level due to noise, the difference between the memory data voltage SA of the selected memory cell and the reference voltage RA is changed and occasionally their polarity may be reversed, resulting in incorrectly reading data.

According to the present invention, the instability like this can be eliminated by approximately equalizing the capacitance of a bit line for memory cell blocks to that of the reference cell block as described above. More specifically, as shown in FIG. 1, the number of diffused contacts BLCs and GNDCs in a selected column of memory cell blocks 100 is equal to that in a reference column of the reference cell block 200. Therefore, the capacitance of a bit line for memory cell blocks is approximately equal to that of the reference cell block.

Further, only one reference cell block 200 is formed in the same cell array 10 as the memory cell blocks 100 by changing the positions of ion implantation. Therefore, the reference cell block 200 can be easily formed.

What is claimed is:

1. A memory device comprising:

a first cell block comprising a plurality of cells, a first bit line being electrically connected to a selected one of the cells;

a second cell block comprising a plurality of cells, a second bit line being electrically connected to a predetermined number of cells, greater than one, which are connected in series; and a comparator for comparing a first signal received from the first bit line to a second signal received from the second bit line to determine a bit data of the selected cell.

2. The memory device according to claim 1, wherein the predetermined number is determined so that the second signal is set to a signal level between an on level and an off level of the first signal which correspond to a 1 and a 0 of the bit data of the selected cell, respectively.

3. The memory device according to claim 1, wherein the first and second cell blocks are formed from a common circuit pattern including a plurality of transistors.

4. The memory device according to claim 1, wherein the comparator comprises:

a first converter for converting a first current flowing through the first bit line to a first voltage;

a second converter for converting a second current flowing through the second bit line to a second voltage; and a differential amplifier for amplifying a difference between the first and second voltages to produce the bit data of the selected cell.

5. The memory device according to claim 1, wherein the first and second cell blocks include diffused contacts and the number of the diffused contacts in the first cell block is equal to the number of the diffused contacts in the second cell block.

6. The memory device according to claim 5, wherein the selected cell is connected to the first bit line through one of the diffused contacts of the first cell block.

7. The memory device according to claim 5, wherein the serially connected cells are connected to the second bit line through one of the diffused contacts of the second cell block.

8. The memory device according to claim 1, wherein a capacitance of the bit line for the first cell block is approximately equal to a capacitance of the bit line for the second cell block.

9. The memory device according to claim 1, wherein a charging speed of the bit line for the first cell block is approximately equal to a charging speed of the bit line for the second cell block.

10. The memory device according to claim 9, wherein the predetermined number is determined so that the second signal is set to a signal level between an on level and an off level of the first signal which correspond to a 1 and a 0 of the bit data of the selected cell, respectively.

11. A memory device comprising:

a plurality of first cell blocks each comprising a plurality of cells and a first bit line contact which is selectively connected to one of the plurality of cells, a predetermined number of first cell blocks being connected to a first bit line through the first bit line contacts thereof;

a plurality of second cell blocks each comprising a plurality of cells and a second bit line contact, a predetermined number of second cell blocks being connected to a second bit line through the second bit line contacts thereof, wherein a predetermined cell block of the plurality of second cell blocks includes a reference element which is formed with a plurality of cells connected in series, the reference element being connected to the second bit line through the second bit line contact of the predetermined cell block; and a comparator for comparing a first signal received from the first bit line to a second signal received from the second bit line to determine a bit data of the selectively connected cell.

12. The memory device according to claim 11, wherein the first and second cell blocks are formed from a common circuit pattern including a plurality of transistors.

13. The memory device according to claim 11, wherein the comparator comprises:

a first converter for converting a first current flowing through the first bit line to a first voltage;

a second converter for converting a second current flowing through the second bit line to a second voltage; and a differential amplifier for amplifying a difference between the first and second voltages to produce the bit data of the selected cell.

14. The memory device according to claim 11, wherein the predetermined number of the first cell blocks is equal to the predetermined number of the second cell blocks.

15. The memory device according to claim 14, wherein the number of cells of the reference element is determined so that the reference signal is set to a signal level between an on level and an off level of the cell signal which correspond to a 1 and a 0 of the bit data of the selected cell, respectively.

16. The memory device according to claim 14, wherein the first signal is transmitted from the selectively connected cell.

17. A memory device comprising:

a plurality of cell blocks arranged in rows and columns and having bit lines for columns, respectively, each cell block comprising a plurality of cells and a bit line contact which is selectively connected to a cell through a selector according to address data, cell blocks in each column being connected to a bit line through bit line contacts thereof;

a bit line selector for selecting one of the bit lines according to the address data; and a sense amplifier for amplifying a difference between a reference signal and a cell signal received from the selectively connected cell through the selected bit line to produce a bit data of the selectively connected cell, wherein the cell blocks include a reference cell block which includes a reference element comprising a plurality of cells connected in series, the reference element being connected to a reference bit line corresponding to the reference cell block through a bit line contact thereof.

18. The memory device according to claim 17, wherein the reference cell block and the other cell blocks are formed from a common circuit pattern including a plurality of transistors.

19. The memory device according to claim 17, wherein the comparator comprises:

a first converter for converting a cell current flowing through the selected bit line to a cell voltage;

a second converter for converting a reference current flowing through the reference bit line to a reference voltage; and a differential amplifier for amplifying a difference between the cell voltage and the reference voltage to produce the bit data of the selected cell.

20. The memory device according to claim 17, wherein the second signal is received from the second bit line.

21. The memory device according to claim 20, wherein a capacitance of the selected bit line is approximately equal to a capacitance of the reference bit line.

22. The memory device according to claim 20, wherein a charging speed of the selected bit line is approximately equal to a charging speed of the reference bit line.

* * * * *